United States Patent
Sakuraba et al.

(10) Patent No.: US 6,354,484 B1
(45) Date of Patent: Mar. 12, 2002

(54) PROCESS FOR PRODUCING A METAL-CERAMIC COMPOSITE SUBSTRATE

(75) Inventors: Masami Sakuraba; Masami Kimura; Masaya Takahara; Junji Nakamura, all of Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 16 days.

(21) Appl. No.: 09/639,832

(22) Filed: Aug. 16, 2000

Related U.S. Application Data

(62) Division of application No. 09/036,855, filed on Mar. 9, 1998, now Pat. No. 6,211,511.

(30) Foreign Application Priority Data

Mar. 12, 1997 (JP) .............................. 9-74676

(51) Int. Cl.⁷ .............................. B32B 15/04
(52) U.S. Cl. .............................. 228/124.1; 228/122.1; 228/123.1; 228/124.5; 228/177; 228/903; 29/428; 29/458
(58) Field of Search ................ 29/428, 458; 228/122.1, 228/123.1, 124.1, 124.5, 177

(56) References Cited

U.S. PATENT DOCUMENTS

| | | | | |
|---|---|---|---|---|
| 4,448,605 A | * | 5/1984 | Mizuhara | |
| 5,354,415 A | * | 10/1994 | Fushii et al. ............... | 156/630 |
| 5,407,119 A | * | 4/1995 | Churchill et al. | |
| 5,539,611 A | * | 7/1996 | Hegner et al. | |
| 5,672,848 A | * | 9/1997 | Komorita et al. | |
| 5,807,626 A | * | 9/1998 | Naba | |
| 5,955,686 A | * | 9/1999 | Sakurba et al. | |

FOREIGN PATENT DOCUMENTS

| | | | |
|---|---|---|---|
| EP | 0 368 126 | * | 5/1990 |
| EP | 0 196 221 | * | 10/1996 |
| JP | 163093 | * | 12/1981 |
| JP | 166165 | * | 8/1985 |
| JP | 101153 | * | 4/1991 |
| JP | 03 101153 | * | 4/1991 |
| JP | 07 172944 | * | 7/1995 |
| JP | 08 097554 | * | 4/1996 |
| JP | 09 188582 | * | 7/1997 |

OTHER PUBLICATIONS

E Lugsheider and W Tillmann, Development of New active filler metals in a Ag–Cu–Hf system, Welding Journal, Nov. 1990, pp. 416–421.*

* cited by examiner

Primary Examiner—Deborah Jones
Assistant Examiner—Jennifer McNeil
(74) Attorney, Agent, or Firm—Nilles & Nilles SC

(57) ABSTRACT

A metal-ceramic composite substitute is produced by joining a metal plate to a ceramic substrate by using a brazing material in a paste form prepared by adding 10–14 parts by weight of a vehicle to 100 parts by weight of a powder of which the solid centent comprises 90.0~99.5% of an Ag powder, 0~9.5% of a Cu powder and 0.5~4.0% of an active metal powder, and 0.0~0.9% of a titanium oxide powder if necessary.

2 Claims, No Drawings

PROCESS FOR PRODUCING A METAL-CERAMIC COMPOSITE SUBSTRATE

This application is a division, of application Ser. No. 09/036,855, filed Mar. 9, 1998 now U.S. Pat. No. 6,211,511.

BACKGROUND OF THE INVENTION

1. Field of the Invention

The present invention relates generally to metal-ceramic composite substrates, and more specifically to brazing materials that can effectively be used in joining metals to ceramic substrates.

2. Description of the Prior Art

Several methods are known in the art of joining metal such as copper plates to ceramic substrates such as aluminum nitride (AlN) and two typical examples are the active metal brazing process described in Japanese Patent Laid-Open No.166165/1985 entitled "A method of Joining Nitride-Base Ceramics to Metals" and the process in which a copper plate is directly joined to a modified surface of an aluminum nitride substrate (as typically described in Japanese Patent Laid-Open No. 163093/1981).

The active metal brazing process provides a higher strength of joint than the direct joining process and the resulting joint has the desired characteristics such as high durability to repeated heat cycles. Hence, the active metal brazing process currently finds extensive use in the joining of copper plates to non-oxide-base ceramic substrates, say, nitride ceramic substrates.

Two brazing materials are commercially used in the practice of the active metal brazing process; one of them is composed of Ag, Cu a nd an active metal selected from among Ti, Zr and Hf (as described in Japanese Patent Laid-Open No.166165/1985) and the other is an active metal paste material composed of Ag, Cu and titanium hydride (as described in Japanese patent Laid-Open No.101153/1991).

Circuit substrates produced by joining copper plates to both sides of an aluminum nitride substrate with the aid of these brazing materials have already been commercialized.

In many brazing materials, an active metal s added to a structure comprising 72% of Ag and 28% of Cu, and accordingly the joining process is carried out at a temperature higher than the eutectic point of 780° C., preferably, at a temperature of around 850° C.

However, most recent circuit substrates are required to perform on larger electrical power and to meet this requirement, it has been desired to develop circuit substrates that are not only provided with good heat dissipating and electrical insulating properties but which also exhibit higher strength and thermal impact resistance.

SUMMARY OF THE INVENTION

An object of the invention is to provide a process for producing metal-ceramic composite substrates using the brazing material.

The present inventors conducted intensive studies in order to attain the stated objects and found that joining processes could be carried out at a temperature of 780° C.~870° C. lower than the melting point of 875° C. by using active metal brazing materials added with 90% of Ag and 9.5% of Cu or 0.5% of an active metal Ti, and that the jointed composite substrates had no non-contact portions.

The present invention has been accomplished on the basis of this finding.

According to a first aspect of the invention, there is provided a metal-ceramic composite substrate produced by joining a metal plate to a ceramic substrate by using a brazing material of which the solid content comprises 90.0~99.5% of Ag, 0~9.5% of Cu, 0.5~4.0% of an active metal on a weight basis.

Said ceramic substrate is at least one kind of ceramic substrate selected from a group consisting of $Al_2O_3$, AlN and $Si_3N_4$.

Said active metal is at least one active metal selected from a group consisting of Ti, Zr and Hf.

There is provided a process for producing a metal-ceramic composite substrate by joining a metal plate to a ceramic substrate, which comprises the steps of:

adding 10–14 parts by weight of a vehicle to 100 parts by weight of a powder of which the solid content comprises 90.0~99.5% of an Ag powder, 0~9.5% of a Cu powder and 0.5~4.0% of an active metal powder on a weight basis;

blending the respective ingredients to form a brazing material in a paste form;

applying the brazing material to the ceramic substrate;

superposing a metal plate on the applied brazing material and heating the assembly at a temperature not higher than the melting point of the brazing material to form a joint of the metal plate and the ceramic substrate; and applying an etching resist on the metal plate of the joint to form a circuit pattern and etching the metal plate to form a metalized circuit.

Said heating temperature of the assembly is in the range of 780° C. to 870° C. which is not higher than the temperature of the melting point of the brazing material.

There is provided a brazing material for use in joining a metal plate to a ceramic substrate, which is in a paste form prepared by blending 10–14 parts by weight of a vehicle with 100 parts by weight of a powder of which the solid content comprises 90.0~99.5% of an Ag powder, 0~9.5% of a Cu powder and 0.5~4.0% of an active metal powder on a weight basis.

There is provided a brazing material for use in joining a metal plate to a ceramic substrate, which is in a paste form prepared by blending 10–14 parts by weight of a vehicle with 100 parts by weight of a powder of which solid content comprises 90.0~99.5% of an Ag powder,0~9.5% of a Cu powder, 0.5~4.0% of an active metal powder and 0.0~0.9% of a titanium oxide powder on a weight basis.

The brazing material to be used in the invention has an Ag content of 90.0~99.5 wt %. If the Ag content is less than 90 wt % unsuitable composite substrates having non-contact portions will be produced.

The Cu content of the brazing material is less than 9.5 wt %. The reason why the Cu content is smaller than that of the conventional Ag—Cu brazing material is that when the assembly is heated the Ag component and the contact surface of the copper plate are reacted to create the eutectic crystalization.

The active metal that can be used in the invention is at least one element of group IVa of the periodic table as exemplified by Ti, Zr or Hf.

These active metals may be added either in an elemental form or as a hydride and the preferred amount of their addition ranges from 0.5 to 4.0 wt %.

Below 0.5 wt %, a nitride layer will form in an insufficient amount to provide the necessary adhesive strength; beyond 4.0 wt %, the adhesive strength is increased, but, on the other hand, cracking is prone to occur after joining a metal plate to a ceramic substrate.

Titanium oxide is added as TiO or $TiO_2$ in an amount ranging from 0.0 to 0.9 wt %. The titanium oxide ma y be amorphous or crystalline.

The present inventors confirmed by experiments that adding these amount of titanium oxide to a brazing material of the composition described above contributed to improvements in various characteristics of the resulting composite substrates such as resistance to repeated heat cycles, flexural strength, deflection and resistance to the passage through a furnace. A probable reason for these contributions would be that the $TiO_2$ or TiO added to the brazing material is dispersed uniformly to reduce the concentration of stresses.

An alloy having the above-defined composition may be directly used as the brazing material of the invention. Alternatively, a powder comprising the particles of the respective Ingredients may be mixed with an organic solvent to form a paste of the brazing material. If a metal member is to be simply joined to a ceramic member, the brazing alloy material in the form of a plate or a foil may be used. If an electronic circuit is to be formed on a ceramic substrate, a paste of the brazing material is preferably used.

In order to prepare the paste of brazing material, 55–75 parts by volume of an organic solvent such as terpineol, toluene, methyl cellosolve or ethyl cellosolve may be mixed with 25–45 parts by volume of an organic binder such as PMMA, methyl cellulose or ethyl cellulose to form a vehicle, which is then added in an amount of 10–14 parts by weight to 100 parts by weight of the powder comprising the particles of the respective ingredients for the brazing material.

If less than 10 parts by weight of the vehicle is used, the resulting paste is so viscous that blurred prints will tend to occur. If more than 14 parts by weight of the vehicle is used, the resulting paste is so low in viscosity that print washout will readily occur.

The present invention is characterized in that the assembly is heated in the furnace at a temperature lower than the melting point of the brazing material, preferably at 780° C.~870° C. according to the composition of the brazing material for the reasons mentioned below.

In case that the conventional brazing material formed of 72% of Ag and 28% of Cu added with an active metal Ti is used, the joining is initiated at a temperature higher than the melting point of Ag—Cu, that is, of 780° C. Accordingly, in practice, the joining is carried out at a temperature of around 850° C. In the present invention, the amount of Ag is more than 90 wt %. If Ag is 90 Wt %, Cu is 9.5 wt % and Ti is 0.5 wt %, the [eutectic] melting point should be a temperature more than 875° C. in consideration of the phase diagram of silver-copper, so that the joining has to be carried out at a temperature of around 900° C. in order to obtain a perfect joint in the convention al process.

If the brazing material of the present invention only is heated at a temperature lower than the melting point (875° C.), it may not be molten but merely sintered. However, in case of using a copper plate as a substrate for the powder module as in the present invention, the brazing material and the copper plate are brought into contact with each other, so that when the assembly is heated Ag in the brazing material and Cu in the copper plate are reacted eutectically gradually from said contact portion in the micron order, Ag is diffused gradually into the copper plate started from said reaction and the eutectic structure is formed on the whole contact surface.

DESCRIPTION OF THE PREFERRED EMBODIMENTS

The following examples are provided for the purpose of further illustrating the present invention but are in no way to be taken as limiting.

EXAMPLE 1

An AlN substrate measuring 53×29×0.635 mm was provided as a ceramic substrate. 100 parts by weight of a powder of which the solid content was shown in a Table 1 (Samples 1–8) were mixed with 12.4 parts by weight of a vehicle to prepare a paste of brazing material. After applying the paste to the whole surface of the AlN substrate, two copper plates having thicknesses of 0.3 mm and 0.15 mm, respectively, were superposed on the respective sides and the assembly was fired at temperatures shown in the Table 1 to produce a joint.

TABLE 1

| SAMPLE | BRAZING MATERIAL wt % | | | FIRING TEMPERATURE | NUMBER OF TEST PIECE | NUMBER OF JOINT HAVING NON-CONTACT SURFACE | RATE OF JOINT HAVING NON-CONTACT SURFACE |
|---|---|---|---|---|---|---|---|
| | Ag | Cu | Ti | | | | |
| NO. 1 | 90.0 | 9.5 | 0.5 | 800° C. | 100 | 1 | 1 |
| | | | | 830 | 100 | 0 | 0 |
| | | | | 860 | 100 | 0 | 0 |
| NO. 2 | 90.0 | 8.0 | 2.0 | 800 | 100 | 1 | 1 |
| | | | | 830 | 100 | 0 | 0 |
| | | | | 860 | 100 | 0 | 0 |
| NO. 3 | 90.0 | 6.0 | 4.0 | 800 | 100 | 0 | 0 |

TABLE 1-continued

| SAMPLE | BRAZING MATERIAL wt % | | | FIRING TEMPERATURE | NUMBER OF TEST PIECE | NUMBER OF JOINT HAVING NON-CONTACT SURFACE | RATE OF JOINT HAVING NON-CONTACT SURFACE |
|---|---|---|---|---|---|---|---|
| | Ag | Cu | Ti/TiO$_2$ | | | | |
| NO. 4 | 99.5 | 0 | 0.5 | 830 | 100 | 0 | 0 |
| | | | | 860 | 100 | 0 | 0 |
| | | | | 800 | 100 | 0 | 0 |
| | | | | 830 | 100 | 0 | 0 |
| | | | | 860 | 100 | 0 | 0 |
| NO. 5 | 98.0 | 0 | 2.0 | 800 | 100 | 0 | 0 |
| | | | | 830 | 100 | 0 | 0 |
| | | | | 860 | 100 | 0 | 0 |
| NO. 6 | 96.0 | 0 | 4.0 | 800 | 100 | 0 | 0 |
| | | | | 830 | 100 | 0 | 0 |
| | | | | 860 | 100 | 0 | 0 |
| NO. 7 | 90.0 | 9.5 | 0.25 | 800 | 100 | 0 | 0 |
| | | | 0.25 | 830 | 100 | 0 | 0 |
| | | | | 860 | 100 | 0 | 0 |
| NO. 8 | 99.5 | 0 | 0.25 | 800 | 100 | 0 | 0 |
| | | | 0.25 | 830 | 100 | 0 | 0 |
| | | | | 860 | 100 | 0 | 0 |

The 100 pieces of each of the samples were tested at many firing temperatures for detecting the non-contact portions.

The results show that the samples having non-contact portion are few.

COMPARATIVE EXAMPLE 1

An AlN substrate of the same dimensions as described in Example 1 was provided as a ceramic substrate.

100 parts by weight of a powder of which the solids content was shown in a Table 2 (Comparative Samples 1–6) were mixed with 12.4 parts by weight of a vehicle to prepare a paste of brazing material. After applying the paste to the whole surface of the AlN substrate, two copper plates having thicknesses of 0.3 mm and 0.15 mm, respectively, were superposed on the respective sides and the assembly was fired at temperatures shown in the Table 2 to produce a joint.

The 100 pieces of each of the samples were tested at many firing temperatures for detecting the non-contact portions as like as the Example 1.

The results show that the many samples having non-contact portion are produced according to the decrease of the Ag density and the firing temperature as shown in the Table 2.

As described on the foregoing pages, the metal-ceramics composite substrates produced by using the brazing material of the present invention are sufficiently improved in the reduction of the non-contact portions, and can be manufactured efficiently with low cost.

While the invention has been particularly shown and described with reference to the preferred embodiments thereof, it will be understood by those skilled in the art that various changes in form and details may be made therein

TABLE 2

| COMPARATIVE SAMPLE | BRAZING MATERIAL wt % | | | FIRING TEMPERATURE | NUMBER OF TEST PIECE | NUMBER OF JOINT HAVING NON-CONTACT SURFACE | RATE OF JOINT HAVING NON-CONTACT SURFACE |
|---|---|---|---|---|---|---|---|
| | Ag | Cu | Ti | | | | |
| NO. 1 | 72.0 | 27.5 | 0.5 | 800° C. | 100 | 81 | 81% |
| | | | | 830 | 100 | 43 | 43 |
| | | | | 860 | 100 | 13 | 13 |
| NO. 2 | 72.0 | 26.0 | 2.0 | 800 | 100 | 75 | 75 |
| | | | | 830 | 100 | 11 | 11 |
| | | | | 860 | 100 | 6 | 6 |
| NO. 3 | 72.0 | 24.0 | 4.0 | 800 | 100 | 68 | 68 |
| | | | | 830 | 100 | 10 | 10 |
| | | | | 860 | 100 | 5 | 5 |
| NO. 4 | 80.0 | 19.5 | 0.5 | 800 | 100 | 31 | 31 |
| | | | | 830 | 100 | 13 | 13 |
| | | | | 860 | 100 | 5 | 5 |
| NO. 5 | 80.0 | 18.0 | 2.0 | 800 | 100 | 25 | 25 |
| | | | | 830 | 100 | 8 | 8 |
| | | | | 860 | 100 | 4 | 4 |
| NO. 6 | 80.0 | 16.0 | 4.0 | 800 | 100 | 20 | 20 |
| | | | | 830 | 100 | 6 | 6 |
| | | | | 860 | 100 | 3 | 3 |

What is claimed is:

1. A process for producing a metal-ceramic composite substrate by joining a metal plate to a ceramic substrate, which comprises the steps of:

adding 10–14 parts by weight of a vehicle to 100 parts by weight of a powder of which the solid content comprises 90.0–99.5% of an Ag powder, 0–9.5% of a Cu powder and 0.5–4.0% of an active metal powder on a weight basis;

blending the respective ingredients to form a brazing material;

applying the brazing material to the ceramic substrate;

superimposing a metal plate on the applied brazing material and heating the assembly at a temperature not higher than the melting point of the brazing material to form a joint of the metal plate and the ceramic substrate; and applying an etching resist on the metal plate of the joint to form a circuit pattern and etching the metal plate to form a metalized circuit.

2. A process for producing a metal-ceramic composite substrate by joining a metal plate to a ceramic substrate, which comprises the steps of:

adding 10–14 parts by weight of a vehicle to 100 parts by weight of a powder of which the solid content comprises 90.0–99.5% of an Ag powder, 0–9.5% of a Cu powder and 0.5–4.0% of an active metal powder on a weight basis;

blending the respective ingredients to form a brazing material in a paste form;

applying the brazing material to the ceramic substrate;

superimposing a metal plate on the applied brazing material and heating the assembly at a temperature not higher than the melting point of the brazing material to form a joint of the metal plate and the ceramic substrate; and applying an etching resist on the metal plate of the joint to form a circuit pattern and etching the metal plate to form a metalized circuit.

* * * * *